(12) United States Patent
Blatchford, Jr. et al.

(10) Patent No.: US 8,569,838 B2
(45) Date of Patent: Oct. 29, 2013

(54) CONTROL OF LOCAL ENVIRONMENT FOR POLYSILICON CONDUCTORS IN INTEGRATED CIRCUITS

(75) Inventors: James Walter Blatchford, Jr., Richardson, TX (US); Yong Seok Choi, Seongnam (KR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/049,862

(22) Filed: Mar. 16, 2011

(65) Prior Publication Data

US 2012/0235242 A1     Sep. 20, 2012

(51) Int. Cl.
*H01L 21/70* (2006.01)
(52) U.S. Cl.
USPC ............................ 257/369; 257/368; 257/377
(58) Field of Classification Search
USPC .......................................... 257/368, 369, 377
See application file for complete search history.

(56) References Cited

U.S. PATENT DOCUMENTS

| 6,977,387 | B2 | 12/2005 | Lee |
| 2008/0142898 | A1* | 6/2008 | Watanabe et al. ............. 257/369 |
| 2009/0256199 | A1* | 10/2009 | Denison et al. ............... 257/343 |
| 2009/0267156 | A1* | 10/2009 | Anderson et al. ............. 257/368 |
| 2010/0302854 | A1 | 12/2010 | Wu et al. |
| 2012/0091531 | A1* | 4/2012 | Baldwin et al. ............... 257/368 |

OTHER PUBLICATIONS

Gupta et al., "Detailed Placement for Enhanced Control of Resist and Etch CDs", Trans. on Comp.-Aided Design of Int. Circ. and Sys., vol. 26, No. 12 (IEEE, 2007), pp. 2144-2157.
Hu et al., "Pattern Sensitive Placement Perturbation for Manufacturability", Trans. on VLSI Systems, vol. 18, No. 6 (IEEE, Jun. 2010), pp. 1002-1006.

\* cited by examiner

*Primary Examiner* — Walter H Swanson
*Assistant Examiner* — Wilner Jean Baptiste
(74) *Attorney, Agent, or Firm* — Jacqueline J. Garner; Wade J. Brady, III; Frederick J. Telecky, Jr.

(57) ABSTRACT

A method of fabricating gate level electrodes and interconnects in an integrated circuit, and an integrated circuit so fabricated, with improved process margin for the gate level interconnects of a width near the critical dimension. Off-axis illumination, as used in the photolithography of deep sub-micron critical dimension, is facilitated by the patterned features having a preferred orientation in a common direction, with a pitch constrained to within a relatively narrow range. Interconnects in that same gate level, for example "field poly" interconnects, that run parallel to an array of gate elements are placed within a specified distance range from the ends of the gate elements, or at a distance sufficient to allow sub-resolution assist features.

10 Claims, 5 Drawing Sheets

CONTROL OF LOCAL ENVIRONMENT FOR POLYSILICON CONDUCTORS IN INTEGRATED CIRCUITS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are directed to the physical layout of polysilicon conductors at locations of integrated circuits away from active transistor regions.

Advances in semiconductor technology in recent years have enabled the shrinking of minimum device feature sizes, such as metal-oxide-semiconductor (MOS) transistor gates, into the deep sub-micron range. For example, according to some advanced manufacturing technologies as of this date, the target MOS transistor gate width after etch is on the order of 30 nm. Because of the strong effect of transistor channel length on the overall performance of the integrated circuit, as well as on the chip area required for fabrication of a given circuit function, the dimension of transistor gate width is typically the smallest patterned feature size in the integrated circuit. As well known in the art, the dimension of the MOS transistor gate width is thus often referred to as the "critical dimension", or "CD".

For some years now, this critical dimension has approached (if not gone beyond) the limits of optical photolithography, considering that the desired gate widths are much smaller than the wavelength of light in the "deep ultraviolet" band that is used in the photolithography of these features. The masked patterning of features having dimensions smaller than the wavelength of the incident light has raised many complex issues in the photolithography process. So-called "resolution enhancement techniques" (or "RETs") have been developed in recent years to extend the capability of optical photolithography to its ultimate fundamental resolution limits.

Off-axis illumination ("OAI") is one RET that is now commonly used in the industry for the photolithographic patterning of critical dimensions in the deep sub-micron range. In general, according to the OAI technique, the light illuminating the mask (i.e., reticle) is constrained to components at an oblique angle to the plane of the mask. For example, OAI is achieved by exposure of the photomask plane through a centrally-obstructed aperture, which blocks on-axis light components yet passes oblique components to the mask plane. This illumination enables higher order pattern information to be projected onto the image plane (i.e., the surface of the photoresist) than would otherwise result from incident light normal to the mask plane. Selection of the aperture allows the angle of diffraction to match a certain feature pitch (i.e., line width plus spacing). This effect of OAI is not present, however, for feature pitches outside of the preferred pitch; indeed, for some pitches, the process margin is severely reduced by OAI. As such, modern integrated circuit layouts suitable for use in connection with OAI constrain the feature pitch to a specified range, in order to take advantage of the higher order pattern information transfer and to avoid the degraded process margin. In addition, these layouts typically constrain the orientation of critical dimension elements to a single direction, to the greatest extent practicable for the circuit function.

Another RET known in the art is the use of sub-resolution assist features (SRAFs) adjacent to and spaced from critical dimension features such as transistor gates. Sub-resolution assist features are photomask features that have a dimension below the minimum that can be successfully printed by the photolithography process. In other words, even though an SRAF is present (and "visible") on the reticle, the SRAF is so narrow that it will not itself print on the photoresist after exposure. However, an SRAF that is properly spaced from a true critical dimension feature (i.e., one that is intended to be printed) provides a diffraction effect similar to an adjacent full-width feature, resulting in proper focus of the desired critical dimension feature. In this manner, a critical dimension feature at an edge of an array, or in some other way farther from the next similar feature by more than the regular spacing, can be properly patterned by use of an SRAF at the same resolution as if the feature were located within the array of regular pitch features.

These resolution enhancement techniques of off-axis illumination and sub-resolution assist features have been incorporated into the photolithography of logic arrays and memory arrays, for gate width features as small as on the order of 45 nm as patterned. So long as the polysilicon layout can be restrained to the preferred orientation, and the pitch constraints obeyed, control and resolution of features at these dimensions can be quite good. However, in many integrated circuits, polysilicon elements are not used only for transistor gates or other regular structures oriented only in the preferred direction. Rather, these integrated circuits avoid the addition of yet another level of metal conductors by using polysilicon conductors as interconnects. Such polysilicon interconnects necessarily extend over isolation oxide, such as field oxide and trench isolation oxide structures, and often must run in a direction perpendicular to the preferred orientation for photolithography. To minimize chip area, these "field poly" structures are patterned and etched to dimensions on the same order as the critical dimension used for transistor gates. But because the regularity of pitch and preferred orientation rules cannot be obeyed for these field poly interconnects and other structures, resolution and critical dimension control is rendered difficult.

BRIEF SUMMARY OF THE INVENTION

Embodiments of this invention provide an integrated circuit and method of fabricating the same having improved photolithography process margin for minimum feature size (i.e., critical dimension) interconnections over isolation structures.

Embodiments of this invention provide such an integrated circuit and method having such improved process margin for interconnects running in directions perpendicular to a preferred orientation of gate structures in the same structural level.

Embodiments of this invention provide such an integrated circuit and method in which the improved process margin is attained without requiring modification of the fabrication process.

Embodiments of this invention provide such an integrated circuit and method in which the improved process margin is attained without substantial increases in chip area.

Embodiments of this invention provide such an integrated circuit and method that maintains compatibility with off-axis illumination photolithography processes.

Other objects and advantages provided by embodiments of this invention will be apparent to those of ordinary skill in the art having reference to the following specification together with its drawings.

This invention may be implemented into a layout of an integrated circuit in which gate-level minimum feature size (i.e., critical dimension) elements have a preferred orientation, for example due to photolithographic patterning of that level by way of off-axis illumination. The integrated circuit includes some gate-level elements that extend away from active regions, for example interconnects disposed over isolation oxide structures and that run in directions other than the preferred orientation. The layout of gate-level elements in this integrated circuit is constrained so that the ends of gate-level lines approaching the interconnects are located either within a given distance from the interconnect, or spaced sufficiently far from the interconnect that a sub-resolution assist feature can be placed in that space. Photolithography process margin for the gate-level structures over isolation oxide can thus be maintained.

DETAILED DESCRIPTION OF THE INVENTION

This invention will be described in connection with one or more of its embodiments, namely as implemented into a metal-oxide-semiconductor (MOS) integrated circuit in which active areas are arranged in regular blocks, because it is contemplated that this invention will be especially beneficial in such an application. However, it is also contemplated that this invention may provide advantages and benefits in other integrated circuit applications. Accordingly, it is to be understood that the following description is provided by way of example only, and is not intended to limit the true scope of this invention as claimed.

Embodiments of this invention are particularly useful in connection with the manufacture of modern MOS integrated circuits in which the smallest features to be defined by way of optical photolithography are of a size less than 100 nm, and especially in such integrated circuits in which these patterned features are smaller than 50 nm. In particular, embodiments of this invention are contemplated to be particularly useful in integrated circuits in which the desired MOS transistor gate width as etched is on the order of 25 to 30 nm. As mentioned above, because defining parameters such as transistor performance and device density are strongly dependent on the transistor gate width of the smallest transistor (i.e., the shortest channel length transistor) that can be reliably fabricated, the minimum patterned transistor gate width is typically the smallest patterned feature size in the integrated circuit. As mentioned above and as well known in the art, the dimension of the MOS transistor gate width in an integrated circuit is therefore often referred to as the "critical dimension", or "CD".

As mentioned above, in integrated circuits for which the critical dimension is in the deep submicron range, some structural features are of a size that is on the order of the wavelength of light used to photolithographically pattern those features. Resolution enhancement features (RETs) such as off-axis illumination (OAI) and sub-resolution assist features (SRAFs) have become important techniques in improving the resolution and integrity of these sub-micron features.

Figure 1A:
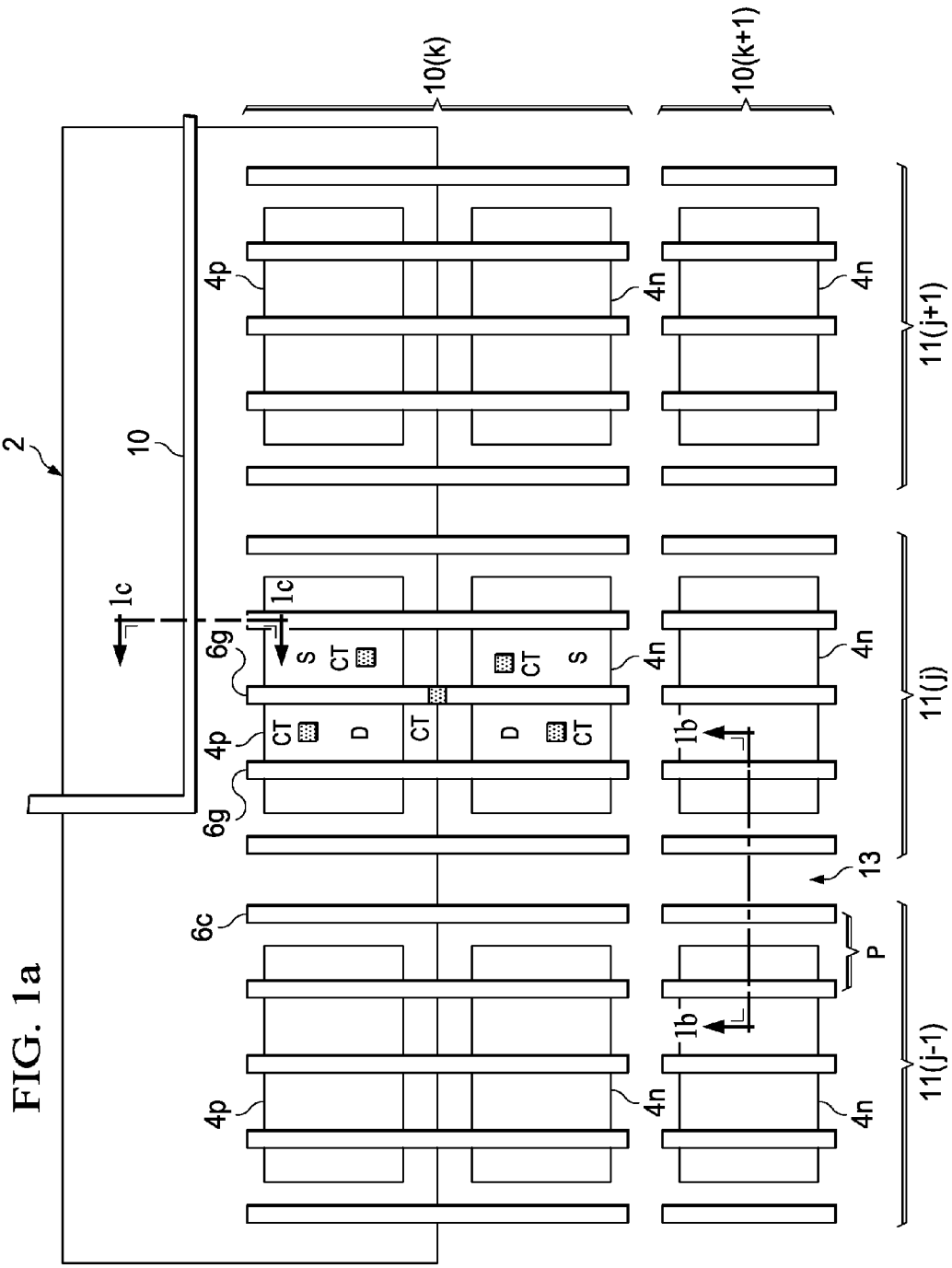
FIG. 1a is a plan view, and FIGS. 1b and 1c cross-sectional views, of a portion of an integrated circuit into which embodiments of this invention are incorporated.
Figure 1B:
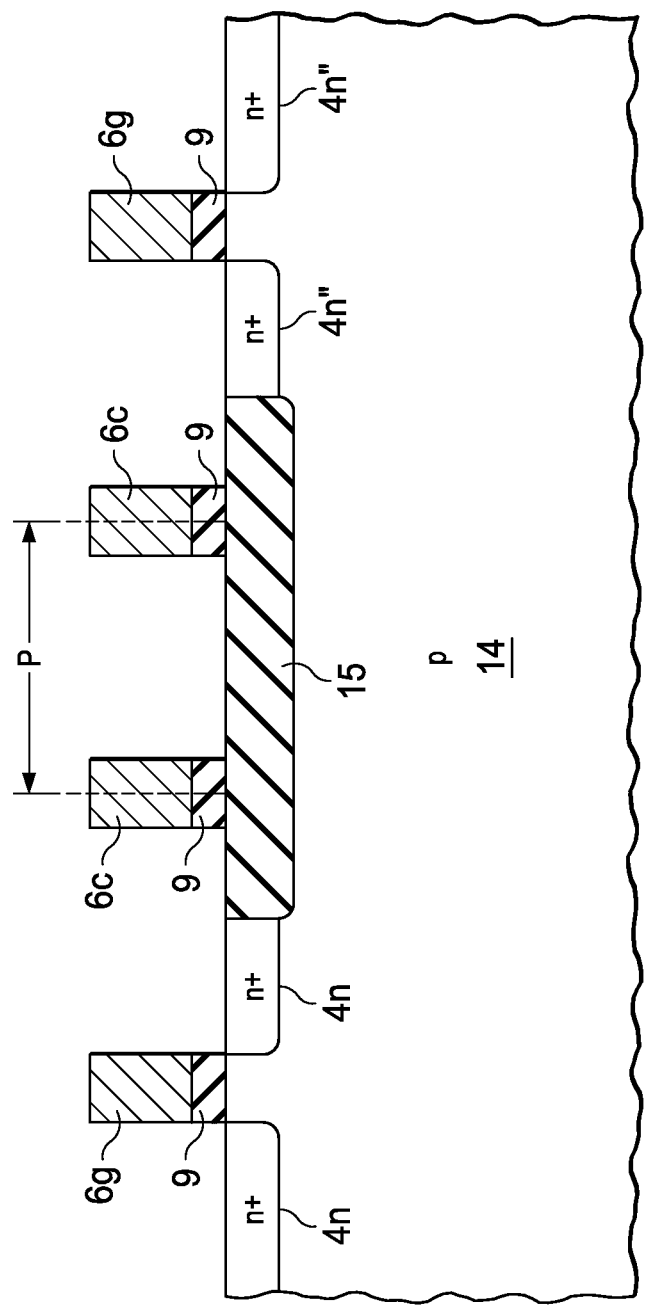
Figure 1C:
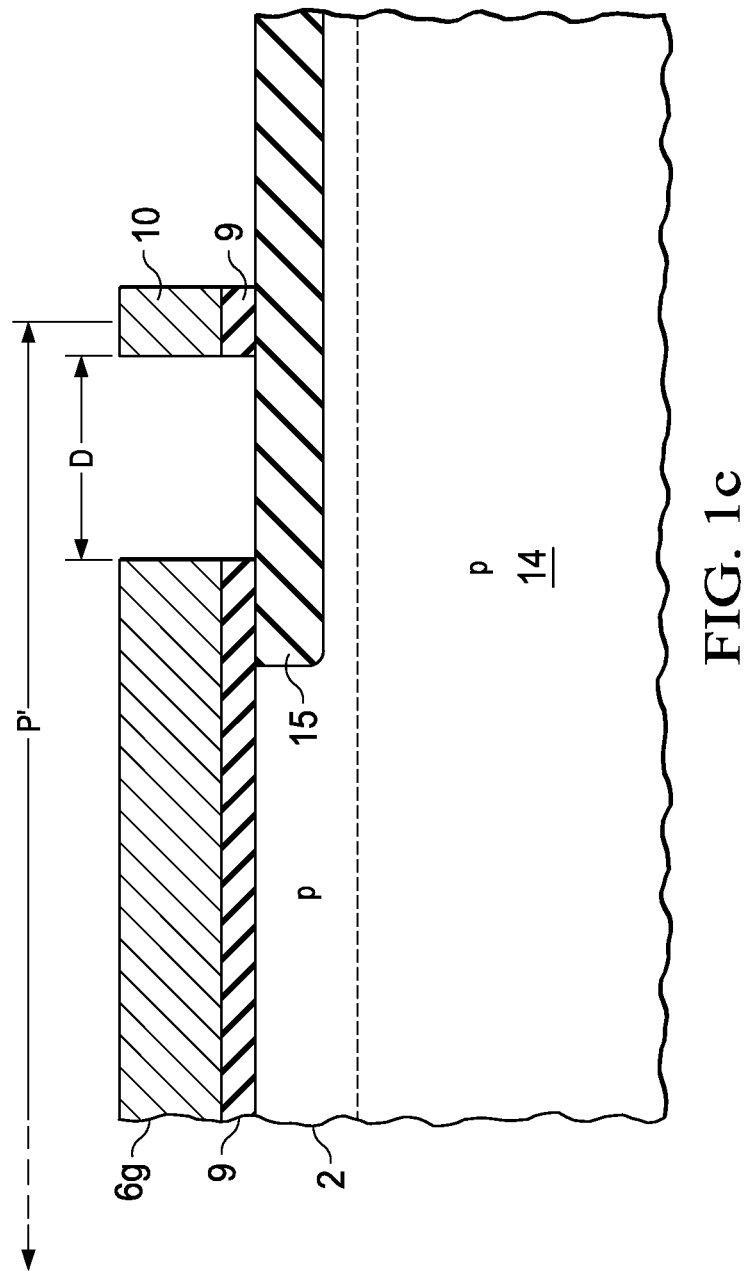

FIGS. 1a, 1b, and 1c illustrate, in plan view and in cross-sectional view, the arrangement of a portion of an integrated circuit constructed according to embodiments of this invention. In this integrated circuit, the critical dimension feature of MOS transistor gate width is in the deep submicron range (e.g., on the order of 45 nm as patterned, and 25 to 30 nm after etch), and as such the above-mentioned resolution enhancement techniques of off-axis illumination and sub-resolution assist features are applicable. As mentioned above, OAI achieves the best results for critical dimension features such as gate electrodes that are arranged to have a substantially constant pitch, and oriented in a common direction.

FIG. 1a illustrates an example of these constraints on transistor gate structures, more specifically an integrated circuit that includes complementary MOS (i.e., CMOS) logic blocks arranged in rows 10 and columns 11. To form both the p-channel and n-channel MOS transistors, each logic block includes both an n-type active region 4n and a p-type active region 4p. For example, the CMOS logic block in row 10(k) and column 11(j) of FIG. 1a includes n-type active region 4n' and p-type active region 4p'. In this example, the integrated circuit is formed by way of a single-well process, specifically with p-type active regions 4p disposed within n-type well 2, and n-type active regions 4n disposed within p-type substrate 14 (shown in FIGS. 1b and 1c). Of course, a twin-well process, in which case n-type active regions 4n would be disposed within a p-type well, may alternatively be used. In either case, active regions 4n, 4p are defined by isolation structures 15 (FIGS. 1b and 1c), which surround each active region 4n, 4p.

Polysilicon gate electrodes 6g overlie each of the active regions 4n, 4p; active regions 4n, 4p in the same CMOS logic block share common gate electrodes 6g. As known in the art, active regions 4n, 4p refer to regions of the surface of the substrate or well at which transistor source and drain regions can be formed, generally in a self-aligned manner relative to polysilicon gate electrode 6g. For example, the portions of active regions 4p visible in FIG. 1a are p-type, and the visible portions of active regions 4n are n-type, by virtue of source/drain ion implantation and anneal performed after the formation of polysilicon gate electrodes 6g. In this regard, the cross-sectional view of FIG. 1b shows two examples of gate electrodes 6g, each having n-type source/drain regions 4n disposed on either side thereof. In each case, gate electrode 6g is separated from the underlying channel region (between source/drain regions 4n) by gate dielectric 9, in the usual manner for MOS transistors. The channel portion of the active region underlying gate electrode 6g will remain n-type in active region 4p, and p-type in active region 4n. The cross-section of FIG. 1c shows gate electrode 6g overlying its p-type channel region, which is a portion of p-type well 2.

Referring back to FIG. 1a, circuits can be formed within a given logic block by the placement of contacts CT and the routing of metal interconnects (not shown) to those contacts CT. For example, FIG. 1a illustrates a CMOS inverter in the logic block of row 10(k) and column 11(j). Contacts CT are formed through the overlying insulator layer to locations on either side of one gate electrode 6g in active region 4p, and also on either side of that same gate electrode 6g in active region 4n. These contacts-to-active serve as connections to the source and drain of each of an n-channel and a p-channel transistor that share the common gate electrode 6g. Another contact CT is made to the common gate electrode 6g itself, to serve as the input of the CMOS inverter; conversely, a metal conductor connection to the contacts CT at the drain of these transistors serves as the inverter output. Similarly, other CMOS circuits will be constructed by the placement of contacts CT and the routing of metal conductors to those contacts CT, as is well known in the art.

As mentioned above, because the integrated circuit of FIGS. 1a through 1c is constructed with sub-micron minimum feature sizes, the use of RETs in the photolithography of these elements constrains the arrangement of polysilicon gate electrodes 6g. One such constraint is commonly enforced by arranging the elements in a preferential common direction, for example the "north-south" direction for polysilicon gate electrodes 6g in FIG. 1a. As discussed above, off-axis illumination (OAI) requires regularity in the spacing (i.e., "pitch", or center line-to-center line distance, or the sum of the width of one element plus the spacing between elements) among critical dimension features in the same level. This requirement is enforced by constraining the pitch of the minimum feature size elements relative to one another to within a relatively narrow range, for example as shown in FIG. 1a by polysilicon gate electrodes 6g being arranged at a substantially constant pitch P among one another. The pitch constraint may be relatively narrow in some cases. For example, in modern deep submicron technologies in which gate electrode widths (as etched) are on the order of 25 to 30 nm, the gate electrode pitch P may be constrained to be within 114 nm to 128 nm.

This regularity, enforced by gate electrode pitch and directionality constraints, is also maintained between columns 11 of logic blocks by polysilicon elements 6c disposed between adjacent active regions 4p, 4n, and that overlie isolation dielectric structures 15 (FIG. 1b). These "dummy" elements 6c have the same width and spacing as gate electrodes 6g, but in this case are not electrically connected to other elements in the circuit. But polysilicon elements 6c maintain the regular pattern of features within the pitch constraints, and in the common direction, in this region of the integrated circuit. More specifically, polysilicon elements 6c assist in the patterning of the outermost gate electrodes 6g in each logic block to have the desired critical dimension gate width and resolution, ensuring the formation of transistors of matched electrical characteristics. Polysilicon elements 6c are of course formed simultaneously with gate electrodes 6g, in the same polysilicon layer, patterned by the same photolithography process.

Other types of integrated circuits are similarly arranged in a regular pattern or array. For example, memory arrays are especially conducive to formation as an array of regularly arranged elements, including minimum feature size (i.e., critical dimension) polysilicon gates having a common orientation direction and a pitch constrained to within a relatively narrow range.

FIGS. 1a and 1c also illustrate unrelated polysilicon interconnect 10, disposed near logic block 10(k), and overlying isolation dielectric structure 15 (FIG. 1c). Polysilicon interconnect 10 and other similar structures are therefore commonly referred to as "field poly" structures. This polysilicon interconnect 10 is formed simultaneously with gate electrodes 6g and polysilicon elements 6c, in the same polysilicon layer and patterned by the same photolithography process. In addition, for purposes of chip area efficiency, polysilicon interconnect 10 has a width that is about the same as the critical dimension width of gate electrodes 6g. However, as evident from the Figures, polysilicon interconnect 10 does not obey the constraint of alignment in the same common direction as polysilicon gate electrodes 6g and elements 6c, but rather is orthogonal to that common direction, as necessary to carry out its interconnection function.

As evident from FIGS. 1a and 1c, the pitch constraint obeyed by polysilicon gate electrodes 6g and elements 6c does not readily apply to the distance D because of their differing directions of travel. It is believed that, from a photolithography standpoint, the distance between the geometric centers of adjacent elements in the same layer is an important factor in the eventual resolution. For gate electrodes 6g, this distance is precisely the center line-to-center line pitch P, and is constrained to the desired range for OAI as discussed above. However, in the case of interconnect 10 and the adjacent gate electrodes 6g, as shown in FIG. 1c, this center-to-center "pitch" P' is much greater than distance D between the neighboring edges of interconnect 10 and the adjacent end of gate electrode 6g. As such, the photolithographic effects of these nearby structures of interconnect 10 and gate electrodes 6g are not well controlled, which translates into a loss of process margin (e.g., resolution and dimensional control) for interconnect 10, as has been observed in practice.

According to embodiments of this invention, therefore, constraints on the relative placement and position of "field poly" structures such as polysilicon interconnects 10, relative to the ends of orthogonal structures such as polysilicon gate electrodes 6g and elements 6c, among others. As will become apparent from the following description, these constraints will ensure good photolithographic process margin for these field poly structures, and thus minimum chip area realization of the integrated circuit including field poly structures formed at the critical dimension such as in the gate layer, and at close spacing among features in that layer.

Figure 2A:
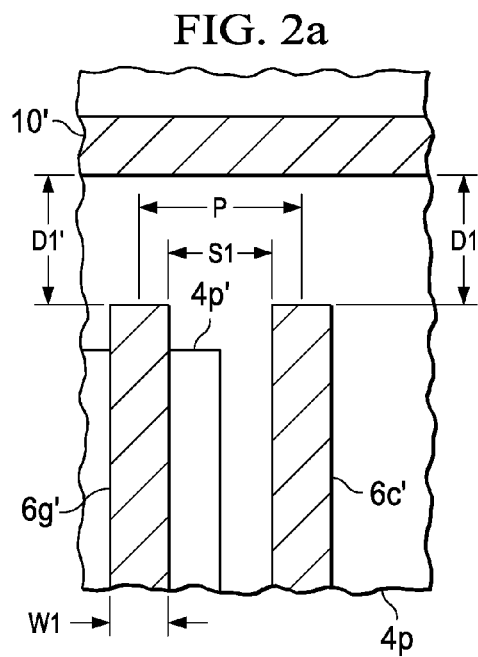
FIGS. 2a through 2d are plan views of a portion of photomasks illustrating gate-level features arranged according to embodiments of the invention.
Figure 2B:
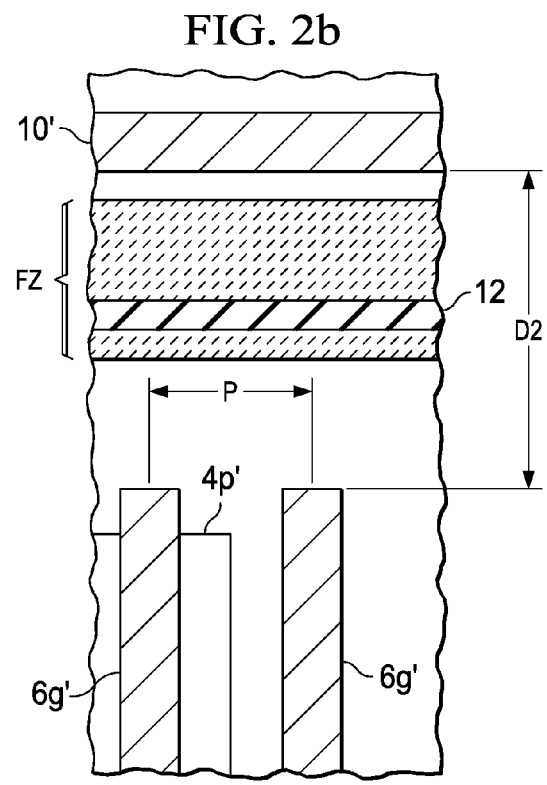

FIGS. 2a and 2b illustrate the spacing constraints of field poly interconnect 10 relative to the ends of polysilicon element photomask features 6c' and polysilicon gate electrodes 6g, as established by their respective photomask elements 10', 6c', and 6g'. As known in the art, design rules controlling the relative placement and spacing of integrated circuit elements to be formed by way of photolithography are typically applied to the construction of the photomasks (i.e., reticles) that are used to selective expose the photoresist during the manufacturing process. Those skilled in the art will also recognize that the eventual sizes of those elements, particularly in the polysilicon gate level in which field poly interconnect 10, polysilicon gate electrodes 6g, and polysilicon element photomask features 6c are formed, will differ from the size of the corresponding photomask elements 10', 6g', 6c' due to the effects of the development process, and also the directionality of the etch of the polysilicon or other layer in which those elements are formed (and whether any intended "overetch" is performed); in addition, subsequent processes such as oxidation or silicidation of the remaining polysilicon, and deposition of cladding on the remaining polysilicon, will alter the eventual size of these elements from that of their corresponding photomask features. The pitch of elements in a given layer, however, does not change from that defined by the photomask, however, considering that pitch amounts to the sum of one width plus one spacing (or, in other words, center line-to-center line distance). Because embodiments of this invention take advantage of certain effects of sub-wavelength photolithography, however, it is contemplated that this description of the spacing and placement of these elements is best presented with reference to the corresponding photomask features 10', 6g', 6c' of FIGS. 2a and 2b, as this avoids the variations caused by development, etch, and subsequent processes as mentioned above.

The photomask features shown in FIGS. 2a through 2d may be opaque features (i.e., light-blocking features) or transparent features (i.e., light passing features, with the remainder of the photomask blocking light), depending on the material being exposed (e.g., photoresist) and whether exposed or unexposed portions of that material cross-link or otherwise solidify after developing. It is contemplated that those skilled in the art having reference to this specification will readily comprehend the particular photomask construction in a manner compatible with the photoresist or other material to be photolithographically patterned.

In FIGS. 2a and 2b, field poly interconnect photomask feature 10', polysilicon gate electrode photomask features 6g', and polysilicon element photomask feature 6c' are shown with reference to the edge of an instance of p-type active region photomask feature 4p'; of course, photomask feature 4p' will be present on a different photomask than that used for photolithography of polysilicon, and as such is illustrated in FIGS. 2a and 2b as essentially a registration mark representing that edge. Of course, at the time of the photolithography of polysilicon interconnect 10 and gate electrodes 6g, active region 4p will typically not yet have been doped p-type (as occurs during the source/drain implant and anneal, which is self-aligned relative to gate electrodes 6g as known in the art). Isolation dielectric structure 15 will of course be present at the time of polysilicon photolithography, as will the "moat" areas into which active regions 4n, 4p will be formed (such moat areas present at those locations at which isolation dielectric structures 15 are not present).

According to embodiments of this invention, the distance between the near edge of interconnect photomask feature 10' for field poly, and the nearest end of orthogonal gate electrode photomask features 6g' and polysilicon element photomask feature 6c', is constrained to be within a specified range, or greater than a specified minimum. In other words, two constraints are applied to this distance between interconnect photomask feature 10' and the nearest end of orthogonal gate electrode photomask feature 6g' and polysilicon element photomask feature 6c'. FIGS. 2a and 2b separately illustrate those constraints. These constraints are in force for those instances of polysilicon interconnect 10 that are to be patterned to a width in the sub-micron range, for example at a width of about 65 nm or less, or in some cases a width of about 42 nm or less. in other words, these constraints are applied to those interconnects 10 that are to be fabricated at or near the critical dimension of minimum gate width, similarly as are the corresponding gate electrodes 6g and elements 6c.

FIG. 2a illustrates a portion of a photomask in which interconnect photomask feature 10' is placed relatively close to the nearest ends of orthogonal gate electrode photomask feature 6g' and polysilicon element photomask feature 6c'. As shown in FIG. 2a, gate electrode photomask feature 6g' and polysilicon element photomask feature 6c' are disposed relative to one another at pitch P (center line-to-center line), as are adjacent instances of gate electrode photomask feature 6g'. According to this embodiment of the invention, this pitch P is constrained to within a relatively tight range (e.g., +/−5% of a nominal pitch value), as suitable for use in connection with off-axis illumination as discussed above. This pitch P amounts to the sum of a nominal photomask feature width W1 plus a nominal spacing S1. According to this embodiment of the invention, distance D1 between the near edge of interconnect photomask feature 10' to polysilicon element photomask features 6c' is defined based on the nominal spacing S1 between adjacent edges of instances of gate electrode photomask features 6g' and polysilicon element photomask feature 6c'. According to this embodiment of the invention, distance D1 ranges from a minimum of about 1.0 times nominal spacing S1, to a maximum of about 1.2 times nominal spacing S1. An example of the actual dimensions for a photomask useful in connection with OAI for the 28 nm "technology node", in an embodiment of this invention, is summarized in this Table 1:

TABLE 1

| Pitch P | Spacing S1 | Distance D1 |
|---|---|---|
| 122 nm ± 7 nm | 70 nm (±5%) | 70 nm ≤ D1 ≤ 90 nm |

This constraint on distance D1 is contemplated to provide good process margin for the formation of polysilicon interconnect 10, despite its placement with no near neighbors running in the same common direction, much less such parallel neighboring elements at a constrained pitch.

FIG. 2a also illustrates an additional constraint on the spacing between interconnect photomask feature 10' and neighboring ends of those gate electrode photomask features 6g' that extend for a relatively short distance over the edge of a corresponding active region 4'. For such an "end cap" gate electrode photomask feature 6g', which in this case is defined as a photomask feature defining a polysilicon line end within a given distance (e.g., about 50 nm) from the edge of the photomask feature defining the corresponding active region (e.g., active region photomask feature 4p'), it is useful to provide a slightly larger minimum distance D1', to allow for the effects of the active region edge by ensuring a slightly larger distance D1' between the "end cap" gate electrode photomask feature 6g' and the near edge of interconnect photomask feature 10'. Of course, the specified range of distance D1 must continue to be obeyed. In this case, therefore, distance D1' ranges from a minimum of about 1.05 times nominal spacing S1 to a maximum of about 1.2 times nominal spacing S1. As such, the specified limits of distance D1' in the example of Table 1 will be altered to 75 nm≤D1'≤90 nm for this end cap feature. If, however, gate electrode photomask feature 6g' were to extend over isolation dielectric structure 15 for a distance greater than the specified end cap distance (e.g., greater than about 50 nm), then there would not be a separate distance D1' constraint, but this line end to interconnect distance would be constrained to the range of distance D1 (i.e., about 1.0 times nominal spacing S1, to a maximum of about 1.2 times nominal spacing S1).

Another acceptable placement of interconnect photomask feature 10' relative to the ends of orthogonal gate electrode photomask feature 6g' and polysilicon element photomask feature 6c' is illustrated in FIG. 2b. In this instance, interconnect photomask feature 10' is located much farther away from the ends of orthogonal gate electrode photomask feature 6g' and polysilicon element photomask feature 6c' (as compared with the case of FIG. 2a). According to this embodiment of the invention, this distance D2 between the near edge of interconnect photomask feature 10' and the ends of gate electrode photomask feature 6g' and polysilicon element photomask feature 6c' is defined relative to pitch P of adjacent instances of gate electrode photomask features 6g'. According to this embodiment of the invention, distance D2 is at least about 1.8 times the minimum acceptable pitch P, or greater. This distance D2 is sufficiently large that a sub-resolution assist feature (SRAF) 12 can be placed between the ends of photomask features 6g', 6c', and interconnect photomask feature 10'. SRAF 12 thus provide sufficient diffraction support to the patterning of polysilicon interconnect 10 to attain sufficient process margin. According to this embodiment of the invention, there is no maximum limit on this distance D2, considering that SRAF 12 serves to provide the necessary resolution and dimensional control in the photolithography of interconnect 10. An example of the actual dimensions for a photomask useful in connection with OAI for the 28 nm "technology node", in an embodiment of this invention, is summarized in this Table 2:

TABLE 2

| Pitch P | Spacing S1 | Distance D2 |
|---|---|---|
| 122 nm ± 7 nm | 70 nm (±5%) | 200 nm ≤ D2 |

According to this embodiment of the invention, therefore, the distance between the near edge of interconnect photomask feature 10' and the ends of unrelated gate electrode photomask features 6g' and polysilicon element photomask features 6c', as the case may be) is constrained to fall within either of the two ranges of (i) between about 1.0 times nominal spacing S1 and about 1.2 times nominal spacing S1, or (ii) at or greater than about 1.80 times the minimum pitch P. A slightly larger minimum spacing may be enforced relative to the ends of unrelated gate electrode photomask features 6g' that define "end cap" structures, as discussed above relative to distance D1'. These constraints result in a "forbidden" range of between 1.2 times the nominal spacing S1 and 1.80 times the minimal pitch P, for the distance between the near edge of interconnect photomask feature 10' and the ends of orthogonal gate electrode photomask features 6g', as shown by forbidden zone FZ in FIG. 2a.

Figure 2C:
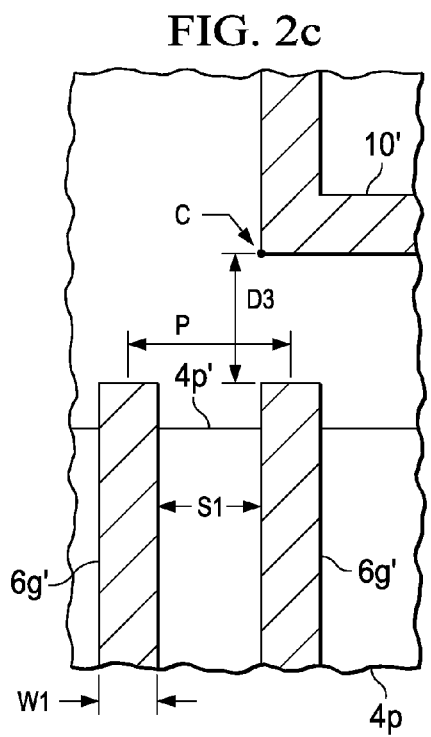

In addition to the constraints on the distance between the edge of interconnect photomask feature 10' and the ends of orthogonal gate electrode photomask features 6g' and polysilicon element photomask features 6c', additional constraints may be applied for other specific features, such as corners of polysilicon interconnect 10 relative to "end cap" structures defined by gate electrode photomask features 6g'. Such an "end cap" is defined by the end of gate electrode photomask feature 6g' being within a specified distance (e.g., at or less than about 50 nm), as described above. FIG. 2c illustrates one such additional constraint, for the case of distance D3 between the corner point C of interconnect photomask feature 10' and the nearest end of "end cap" gate electrode photomask feature 6g', as shown. According to this embodiment of the invention, this distance D3 of this corner point must be at or greater than about 1.2 times the nominal spacing S1 between adjacent gate electrode photomask features 6g'. In the example described above relative to Tables 1 and 2, this distance D3 is constrained to be at or greater than about 90 nm, between corner point C and its nearest neighboring end of a corresponding "end cap" gate electrode photomask feature 6g', as shown in FIG. 2c. This corner distance constraint is contemplated to allow good process margin for the photolithography of polysilicon interconnect 10 having such a corner portion.

Figure 2D:
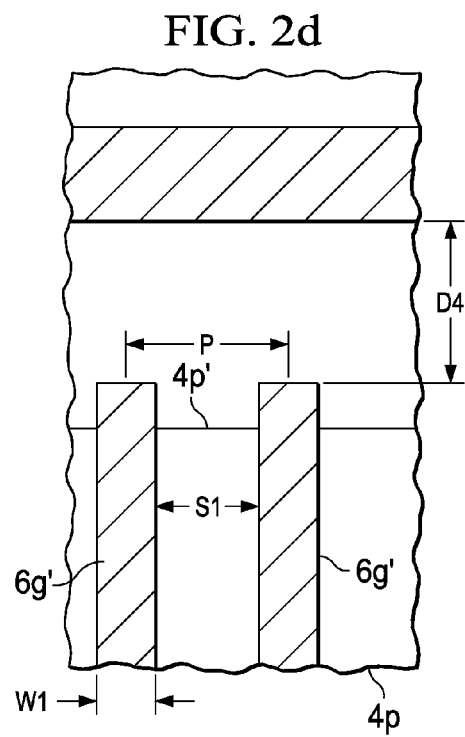

A different constraint relative to that described above relative to FIG. 2c applies in the case that interconnect photomask feature 10' defines a polysilicon interconnect 10 of a wider photomask feature size. As shown in FIG. 2d, interconnect photomask feature 10" is substantially wider than feature 10' shown in FIGS. 2a through 2c. According to this embodiment of the invention, because of the photolithographic interaction between the wider interconnect photomask feature 10' and those photomask features 6g' defining "end cap" structures, distance D4 between the near edge of interconnect photomask feature 10" and the neighboring orthogonal ends of "end cap" gate electrode photomask features 6g' is also specified in these design rules. For the example of the 28 nm technology node dimensions described above relative to Tables 1 and 2, this distance D4 between wider polysilicon interconnect photomask feature 10' and the neighboring ends of "end cap" gate electrode photomask features 6g' is specified to be at or greater than about 90 nm (i.e., at or greater than 1.2 times spacing S1), similarly to the specified distance D3 relative to corner point CP, described above relative to FIG. 2c.

These rules as applied to the construction of the photomasks used in the photolithography of the gate level conductor (typically polysilicon) are contemplated to ensure good photolithography process margin for critical dimension features in the gate level conductors overlying isolation dielectric structures. By their nature as interconnects and conductors outside of a regular array, these conductors are oriented in directions other than the preferred orientation for off-axis illumination, and thus cannot conform to the constrained preferred pitch of the array gate level structures.

Figure 3:
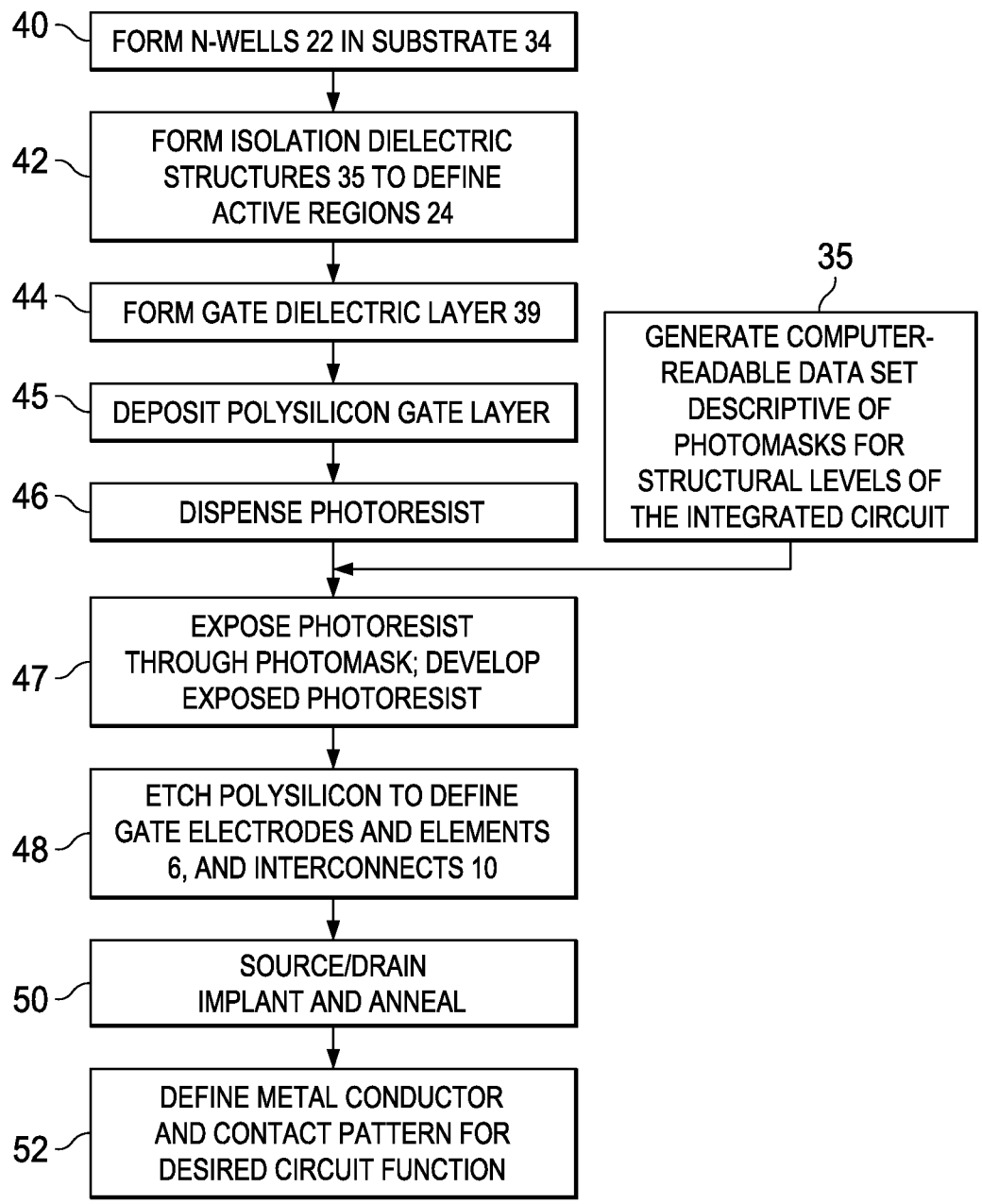
FIG. 3 is a flow diagram illustrating the fabrication of an integrated circuit according to embodiments of the invention.

A generalized manufacturing flow for the fabrication of an integrated circuit, including use of a photomask constructed according to embodiments of the invention as described above, will now be described in connection with FIG. 3. As will be evident to those skilled in the art having reference to this specification, many alternatives to this flow can be used in connection with embodiments of this invention, such alternatives including the addition of various processes and operations and also changes in the sequence of those processes. As such, the process flow of FIG. 3 is provided by way of example only, to provide context to the detailed description of embodiments of this invention provided herein.

In process 35, photomasks that are to be used in the fabrication of an integrated circuit are generated, such photomasks including one or more photomasks including features arranged according to embodiments of the invention, such as the examples described above. It is contemplated that some or all of the steps of this method will generally be carried out by way of a computer system executing computer-aided-design software tools, particularly such tools useful in generating integrated circuit layouts from electrical schematic representations. As known in the art, these computer-aided-design software tools generate integrated circuit layouts by the application of design rules. These design rules specify such parameters as the sizes and layout of various conductors, contact openings, and other photolithographically patterned features to be defined in the integrated circuit. As known in the art, if initial layout design is generated in an automated manner, the layout is often optimized interactively by experienced design engineers, again according to the defined design rules.

According to embodiments of this invention, process 35 defines photomasks in which one or more conductor levels, particularly the gate conductor level that defines MOS transistor gate electrodes, define minimum feature size elements (i.e., are critical dimension features) that are arranged in a preferred orientation (i.e., direction), at a pitch (width plus spacing) that is constrained to a relatively narrow range, for compatibility with resolution enhancement features (RETs) including off-axis illumination (OAI). Those integrated circuits are thus defined by a layout including one or more arrays of repetitive features, such as memory elements or logic gates, arranged according to the common orientation with constrained pitch. According to embodiments of this invention, the photomask features defining non-array features such as field poly interconnects are placed, in process 35, relative to gate elements in the memory, logic, and other arrays, according to constraints such as those described above in connection with FIGS. 2a through 2d.

In process 35, the gate conductor level and other critical dimension feature levels are defined, as are the layouts of all structural levels and other levels to be realized has been defined. Upon completion and verification of the layout, the computer system executing computer-aided design software tools and the like generates the appropriate computer-readable data set that is descriptive of the photomasks to be used in the manufacture of the integrated circuit. As known in the art, this computer-readable data set is expressed in any one of a number of conventional formats used by photomask "writing" or other photomask generation tools, either directly or by way of additional processing and conversion. An example of the process of generating such a photomask pattern data set is described in commonly assigned U.S. Pat. No. 7,765,516 B2, incorporated herein by reference. Process 35 also includes, for purposes of this description, the creation of physical photomasks or reticles, with features defined on those photomasks arranged according to embodiments of this invention as described above. The appropriate gate level photomask will be used in the photolithography of the gate conductor layer, in the fabrication of the desired integrated circuit as will now be summarized in connection with FIG. 3.

In this example, actual physical fabrication of the integrated circuit begins with process 40 in which wells (e.g., n-wells 2 of FIG. 1a) are formed in the conventional manner at selected locations of the surface of a substrate of a single-crystal silicon wafer of the desired conductivity type and dopant concentration, of a single-crystal layer of silicon overlying an insulator layer disposed on a handle wafer (according to conventional silicon-on-insulator technology), or of an alternative starting material to these typical substrate structures. For a double-well process, p-type wells would be similarly formed at locations apart from those of n-wells 22. In process 42, isolation dielectric structures 15 are formed at selected locations of the surface of the substrate, both within and outside of n-wells 2 in this example. In modern integrated circuits, these isolation dielectric structures are formed using shallow trench isolation techniques; alternatively, local oxidation of silicon (LOCOS) isolation oxide can be thermally formed. As known in the art, those "moat" locations of the surface of the substrate at which isolation dielectric structures are not formed will become the active regions at which transistors will eventually be formed.

In process 44, a gate dielectric layer is formed over the active regions defined by the isolation dielectric structures resulting from process 42. This gate dielectric layer may be silicon dioxide, formed by thermal oxidation of the exposed silicon in these active regions or by deposition, deposited silicon nitride, a combination or stack of silicon dioxide and silicon nitride, or such other transistor gate dielectric material as known in the MOS transistor art. Polycrystalline silicon is then deposited overall, in process 46.

The polysilicon level deposited in process 46 is then photolithographically patterned and etched to define the gate level structures of polysilicon gate electrodes 6g, polysilicon elements 6c, and polysilicon interconnects 10, among other features. According to embodiments of this invention, as known in the art, this photolithography process includes process 46, in which a photoresist (i.e., photo-sensitive masking material) is dispensed over the polysilicon gate layer deposited in process 45. In process 47, this photoresist or other masking material is exposed to illuminating light of the desired wavelength (e.g., on the order of 250 nm) through a photomask (or reticle) constructed in process 35. As discussed above, this gate level photomask is arranged according to the design rules described above in connection with embodiments of this invention. It is contemplated that RETs including OAI, as well as sub-resolution assist features in this photomask, and the like can be applied in process 47 to define critical dimension polysilicon features in this polysilicon level, including those of deep sub-micron dimensions (e.g., as small as less than 50 nm in width). Process 47 concludes with the developing of the exposed photoresist to define etch-resistant masking elements overlying those portions of the polysilicon gate layer to remain. Conventional etch processes are then performed in process 48, using the developed photoresist itself (or an underlying "hard" mask having a pattern defined by the photoresist masking elements) as the masking elements for this etch.

In this example of the fabrication of the integrated circuit in FIG. 3, conventional additional processing is then performed after formation of the gate level conductors. This additional processing includes the completion of MOS transistors in this integrated circuit, including such operations as threshold voltage adjust implant, and ion implant and subsequent activation anneal of the source/drain regions, shown in FIG. 3 by way of process 50. As typical in the art, doping of these source/drain regions is performed in a self-aligned manner relative to gate electrodes 6g formed in processes 46, 48. And in this summary description, process 52 refers to the formation of contact openings through overlying insulator layers to contact gate electrodes 6g and active regions 4 (e.g., as shown in FIG. 1a), and also the deposition and patterning of the desired metal conductor routing into those contact openings and elsewhere in the integrated circuit. Other processes useful in the fabrication of actual integrated circuits, as known in the art, will be performed at the appropriate stages in this fabrication flow, as known by those skilled in the art having reference to this specification.

According to embodiments of this invention, as described above, the arrangement of field poly interconnects and other similar structures of minimum feature size, i.e., at the critical dimension, takes advantage of resolution enhancement techniques such as off-axis illumination, despite being placed at locations that necessarily cannot conform to the desired common orientation direction of similar critical dimension features in that layer, and that necessarily cannot conform to close constraints on feature pitch as applied to the commonly oriented structures. Embodiments of this invention enable the fabrication of these interconnect and other elements with excellent process margin, even at deep sub-micron dimensions.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit formed at a semiconducting surface of a body, comprising:
at least one active area at the semiconducting surface;
a plurality of electrodes formed at a gate level in the integrated circuit, each electrode extending for a length in a common direction with others of the plurality of electrodes, each electrode having a width at about a critical dimension for the integrated circuit, the critical dimension corresponding to a minimum photolithographically patterned feature size for the integrated circuit, the plurality of electrodes disposed relative to one another at a substantially constant pitch within a preselected range;

an isolation dielectric structure disposed at the surface, and defining the boundary of the at least one active area; and the at least one interconnect, formed at the gate level in the integrated circuit, and disposed over the isolation dielectric structure, the at least one interconnect having a width at about the critical dimension for the integrated circuit, the at least one interconnect having a portion disposed at a location overlying the isolation dielectric structure that has a length extending in a direction substantially perpendicular to the common direction of the plurality of electrodes;

wherein the plurality of electrodes and the the at least one interconnect are formed by a process comprising the steps of:

depositing a conductor layer over the at least one active area and isolation dielectric structure;

photolithographically patterning and etching the conductor layer using a photomask defining features in the conductor layer in which, for each of the plurality of electrodes that has a portion disposed over the isolation dielectric structure having an end located closest to the at least one interconnect, that end is disposed at a distance from the at least one interconnect between about 1.00 and about 1.20 times the nominal spacing of photomask features defining the electrodes, or greater than about 1.80 times the pitch.

2. The integrated circuit of claim 1, wherein the plurality of electrodes, the at least one interconnect, and the plurality of electrodes comprise polycrystalline silicon.

3. The integrated circuit of claim 1, wherein the plurality of electrodes comprises:

a plurality of transistor gate electrodes, each having a portion extending in the common direction over the at least one active area;

and further comprising:

transistor source/drain regions, each disposed at the surface of the active area on a side of the portion of a corresponding gate electrode extending in the common direction over that active area.

4. The integrated circuit of claim 3, wherein the plurality of electrodes further comprises:

at least one dummy electrode formed at the gate level, the dummy electrode having at least a portion of a width at about the critical dimension for the integrated circuit, overlying the isolation dielectric structure, that portion of the dummy electrode extending in the common direction, and disposed relative to a neighboring one of the plurality of transistor gate electrodes by the substantially constant pitch.

5. The integrated circuit of claim 1, wherein the portion of the one of the plurality of electrodes having an end located closest to the at least one interconnect has a width at about the critical dimension for the integrated circuit.

6. The integrated circuit of claim 1, wherein the critical dimension is less than about 65 nm.

7. The integrated circuit of claim 6, wherein the critical dimension is about 42 nm or less.

8. The integrated circuit of claim 1, wherein the at least one interconnect has a corner portion disposed over the isolation dielectric structure, and disposed at a location that is in the common direction from an end of one of the plurality of electrodes that is within a specified distance from an edge of the active region;

and wherein the distance between the photomask feature defining the corner portion of the at least one interconnect and the photomask feature defining the end of the electrode is greater than about 1.20 times the nominal spacing.

9. The integrated circuit of claim 1, wherein, for each of the plurality of electrodes that has an end disposed over the isolation dielectric structure within a specified distance from an edge of the active region, the photomask feature defining that end of the electrode is at a distance of at least about 1.05 times the nominal spacing away from the photomask feature defining the at least one interconnect.

10. The integrated circuit of claim 1, wherein, for each of the plurality of electrodes that has an end disposed over the isolation dielectric structure within a specified distance from an edge of the active region, the photomask feature defining that end of the electrode is at a distance of at least about 1.20 times the nominal spacing away from the photomask feature defining a second interconnect, the second interconnect having a width greater than the critical dimension.

* * * * *